United States Patent
Doi

(10) Patent No.: US 9,184,904 B2
(45) Date of Patent: Nov. 10, 2015

(54) COMMUNICATION SYSTEM, RECEIVER, AND EYE-OPENING MEASURING METHOD

(71) Applicant: FUJITSU LIMITED, Kawasaki-shi, Kanagawa (JP)

(72) Inventor: Yoshiyasu Doi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/513,782

(22) Filed: Oct. 14, 2014

(65) Prior Publication Data

US 2015/0139375 A1     May 21, 2015

(30) Foreign Application Priority Data

Nov. 21, 2013    (JP) ................................. 2013-240985

(51) Int. Cl.
*H04L 7/00*        (2006.01)
*H04L 7/04*        (2006.01)

(52) U.S. Cl.
CPC ............ *H04L 7/0012* (2013.01); *H04L 7/0087* (2013.01); *H04L 7/043* (2013.01)

(58) Field of Classification Search
CPC ... H04L 7/0012; H04L 7/0331; H04L 7/0087; H04L 7/043; H04L 1/205; H03L 7/08
See application file for complete search history.

(56) References Cited

U.S. PATENT DOCUMENTS

| | | | |
|---|---|---|---|
| 2006/0050827 A1* | 3/2006 | Saeki et al. | 375/362 |
| 2006/0120496 A1 | 6/2006 | Okamura | |
| 2009/0224809 A1* | 9/2009 | Matsumoto et al. | 327/141 |
| 2010/0023826 A1 | 1/2010 | Noguchi | |
| 2014/0192935 A1* | 7/2014 | Palusa et al. | 375/340 |

FOREIGN PATENT DOCUMENTS

| | | |
|---|---|---|
| JP | 2004-153712 A | 5/2004 |
| JP | 2005-117368 A | 4/2005 |
| JP | 2009-212992 A | 9/2009 |
| JP | 2012-54720 A | 3/2012 |
| WO | WO 2008/126429 A1 | 10/2008 |

* cited by examiner

*Primary Examiner* — Syed Haider
(74) *Attorney, Agent, or Firm* — Arent Fox LLP

(57) ABSTRACT

A communication system includes: a plurality of lanes; a plurality of transmission circuits respectively outputting data to the lanes in accordance with a transmission clock; and a plurality of reception circuits respectively receiving data from the lanes, each reception circuit includes: a clock data recovery circuit extracting own clock information from received data: a clock information switch circuit selecting either one of the own clock information of the reception circuit or another own clock information of an another reception circuit; a phase shifter generating a phase adjusted clock from a common reception clock source in accordance with clock information selected by the clock information switch circuit; and an input circuit taking in transmitted data in accordance with the adjusted clock, and the clock information switch circuit selects the own clock information in a normal operation and selects the another own clock information in an eye-opening measurement operation.

9 Claims, 13 Drawing Sheets

A1　　A2
　　C

BATHTUB

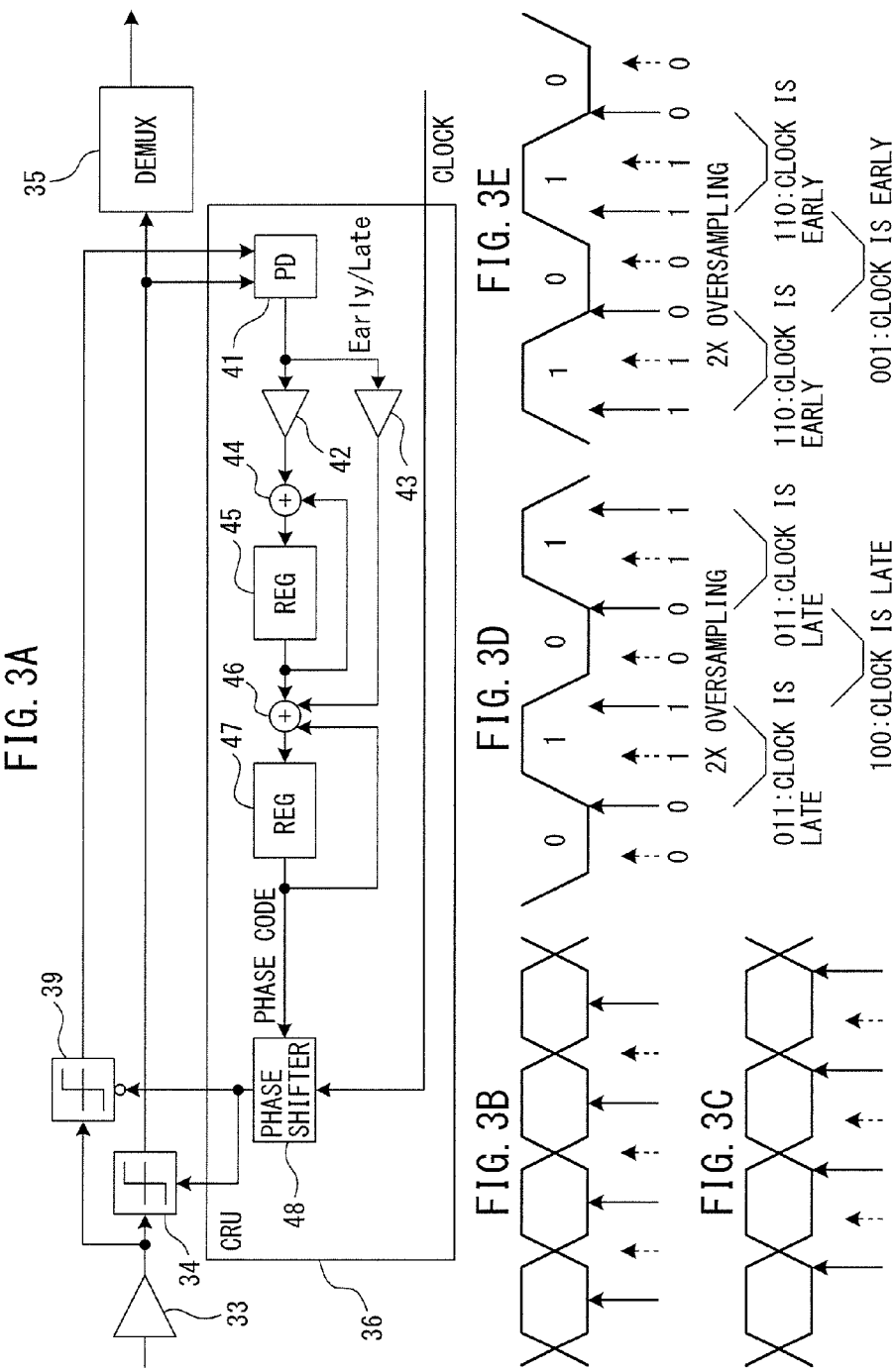

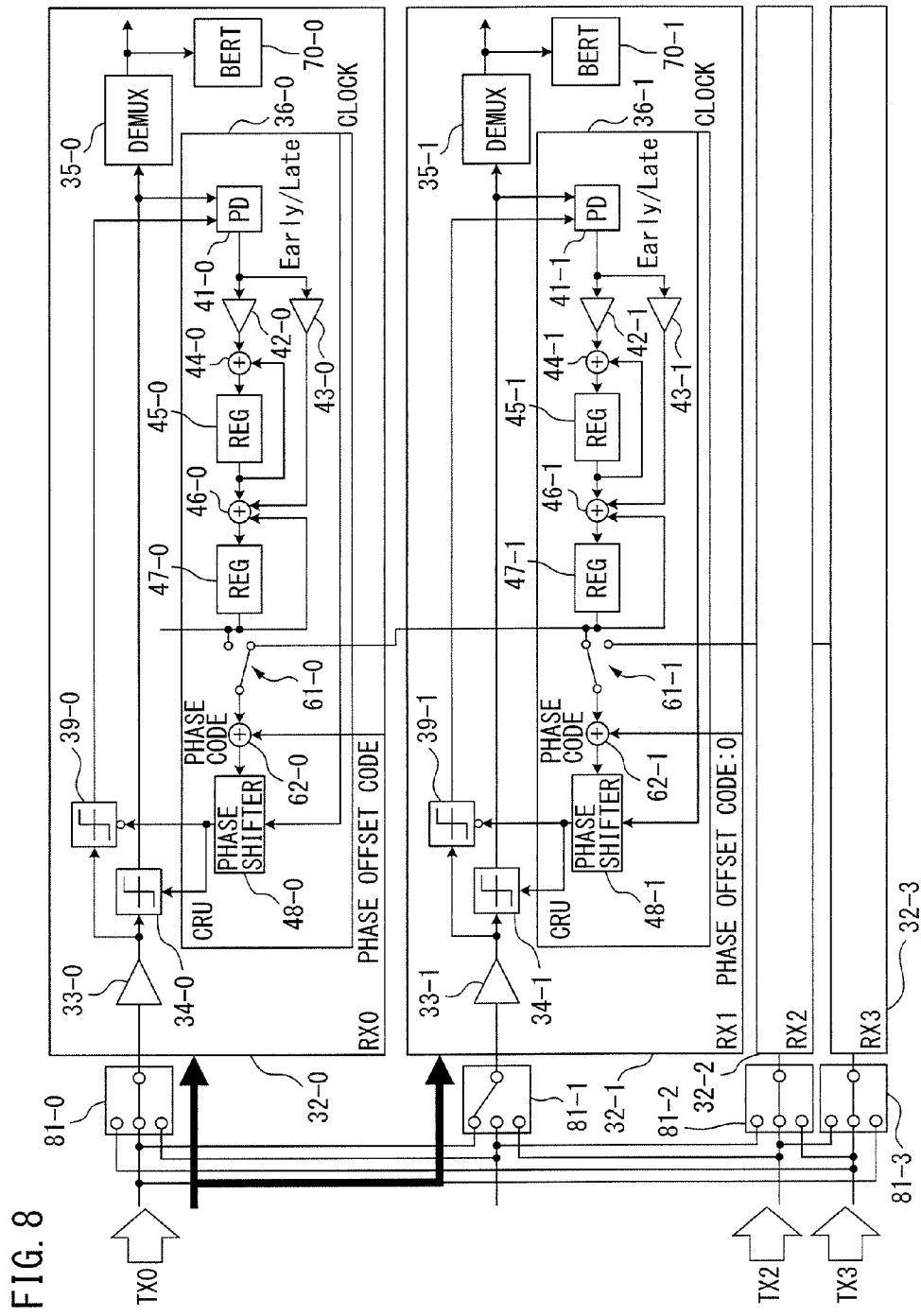

COMMUNICATION SYSTEM, RECEIVER, AND EYE-OPENING MEASURING METHOD

CROSS-REFERENCE TO RELATED APPLICATION

This application is based upon and claims the benefit of priority of the prior Japanese Patent Application No. 2013-240985, filed on Nov. 21, 2013, the entire contents of which are incorporated herein by reference.

FIELD

This application relates to a communication system, a receiver, and an eye-opening measuring method.

BACKGROUND

Signals are transmitted between LSI chips, between a plurality of circuit blocks within a casing, and between casings. A data signal transmission rate is demanded to be increased.

The performance of components configuring a computer and other information processing devices has improved considerably. For example, performances of a memory, a processor, and a switch LSI have improved. In order to improve the performance of a system, it is necessary to improve the signal transmission rate between these components or elements as well as improving the performance of the components. For example, in order to improve the performance of a computer (server), it is effective to improve the signal transmission rate between a memory, such as an SRAM and a DRAM, and a processor. In addition to a server, it is effective to improve the data rate in signal transmission and reception inside and outside a device as the performance of an information processing device, such as a communication infrastructure-specific device is improved.

In a communication system having improved the data rate, after converting parallel data into serial data, the transmission side outputs the data to a transmission line as one-bit data in accordance with a transmission clock. The reception side recovers a reception clock corresponding to the transmission clock from the received data and takes in data at optimum timing. Because of this, the reception side has a circuit configured to perform clock data recovery (CDR) to recover the reception clock from the received data and a phase shifter configured to adjust the phase of the clock. A circuit that performs CDR is referred to as a CRU (Clock Recovery Unit). The CRU and the phase shifter are circuits whose circuit scale is large.

Further, in high-rate data communication, it is important to receive data in a stable manner and on the reception side, deterioration of received data signal is measured. The quality of the received data signal on the reception side is normally represented by an eye-opening, and therefore, an eye-opening monitoring function to perform eye-opening measurement is provided on the reception side and the eye-opening measurement is performed at the time of initialization and whenever necessary.

As described above, an attempt is made to improve the data rate in serial communication, however, it is difficult to improve the data rate greatly. Because of this, a communication system has been examined, which improves the data communication rate by providing a plurality of lanes through which communication is performed at a data rate resembling the above-mentioned data rate and by performing parallel data communication. In this communication system, the communication rate, which is the data rate of each lane multiplied by the number of lanes, is obtained, and therefore, the communication rate improves greatly.

This communication system has a communication path having a plurality of transmission lines (lanes), a transmitter having a plurality of transmission circuits, and a receiver having a plurality of reception circuits. As to the clock of the communication system, there are two cases: a case where clock sources having similar oscillation frequencies are provided in the transmitter and the receiver, respectively; and a case where a clock transmission line is provided separately from that of data, and a clock is transmitted from the transmitter and the receiver recovers the received clock. In either case, when the clock rate is high, a deviation of phase between lanes cannot be ignored, and therefore, the CRU is provided in each of the plurality of reception circuits. In the following explanation, a communication system is explained as an example, in which clock sources having similar oscillation frequencies are provided in the transmitter and the receiver, respectively.

Further, the communication system having a plurality of lanes is also required to measure the quality of the received data signal in each of the plurality of reception circuits in the case where the communication rate of each lane is high, and therefore, the eye-opening monitoring function is provided in each of the plurality of reception circuits. However, in order to implement the eye-opening monitoring function, it is necessary to separately provide an eye-opening monitoring circuit resembling the CRU for implementing the CDR function or a phase shifter of the CRU. If the CRU and the circuit having implemented the eye-opening monitoring function are provided in each of the plurality of reception circuits, there is such a problem that the circuit (hardware) scale increases.

RELATED DOCUMENTS

[Patent Document 1] Japanese Laid Open Patent Document No. 2004-153712
[Patent Document 2] Japanese Laid Open Patent Document No. 2009-212992
[Patent Document 3] Japanese Laid Open Patent Document No. 2012-054720
[Patent Document 4] Japanese Laid Open Patent Document No. 2005-117368
[Patent Document 5] Japanese Laid Open Patent Document No. 2009-212992
[Patent Document 6] Japanese Patent No. 4706885

SUMMARY

According to a first aspect, a communication system includes: a communication path having a plurality of lanes; a transmitter having a plurality of transmission circuits configured to respectively output data to the plurality of lanes in accordance with a transmission clock from a common transmission clock source; and a receiver having a plurality of reception circuits configured to respectively receive data transmitted from the plurality of lanes, wherein each of the plurality of reception circuits includes: a clock data recovery circuit configured to extract own clock information from received data: a clock information switch circuit configured to select either one of the own clock information of the reception circuit or another own clock information, which is the own clock information of an another one of the plurality of reception circuits; a phase shifter configured to generate an adjusted clock by performing phase adjustment of a reception clock from a common reception clock source in accordance with clock information selected by the clock information switch circuit; and an input circuit configured to take in transmitted data in accordance with the adjusted clock, and the clock information switch circuit selects the own clock information in a normal operation and selects the another own clock information in an eye-opening measurement operation.

According to a second aspect, a receiver has a plurality of reception circuits configured to receive data transmitted via a plurality of lanes in accordance with a transmission clock from a common transmission clock source, wherein each of the plurality of reception circuits includes: a clock data recovery circuit configured to extract own clock information from received data; a clock information switch circuit configured to select either one of the own clock information of the reception circuit and another own clock information, which is the own clock information of an another one of the plurality of reception circuits; a phase shifter configured to generate an adjusted clock by performing phase adjustment of a reception clock from a common reception clock source in accordance with clock information selected by the clock information switch circuit; and an input circuit configured to take in data transmitted in accordance with the adjusted clock, and the clock information switch circuit selects the own clock information in a normal operation and selects the another own clock information in an eye-opening measurement operation.

According to a third aspect, an eye-opening measuring method for measuring an eye-opening of each of a plurality of reception circuits configured to receive data transmitted via a plurality of lanes in accordance with a transmission clock from a common transmission clock source, the method includes: making an another reception circuit, not a reception circuit of which the eye-opening is measured, to perform a normal operation and to extract own clock information from received data; by the reception circuit of which the eye-opening is measured, receiving the own clock information as another piece of clock information from another reception circuit, and generating an adjusted clock by performing phase adjustment of a reception clock from a common reception clock source in accordance with the another own clock information; taking in data input to the reception circuit of which the eye-opening is measured in accordance with the adjusted clock; generating the adjusted clock by adding phase offset information to the another own clock information and repeating the taking-in of the data while changing the phase offset information; and calculating eye-opening information by performing statistical processing on data taken in repeatedly.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 3A is a block diagram illustrating a circuit configuration of the CRU that performs CDR (Clock Data Recovery);

FIG. 3B to FIG. 3E are time charts explaining the operation of the circuit in FIG. 3A FIG. 4A and FIG. 4B are diagrams explaining the sweep operation of the eye-opening monitoring function;

FIG. 8 is a block diagram illustrating a configuration of a receiver of a second embodiment;

FIG. 9A illustrates an example of the initial phase relationships between the data latch clock and the boundary latch clock in the RX 0 and the RX 1, and FIG. 9B illustrates an example after a long time elapses;

DESCRIPTION OF EMBODIMENTS

Before explaining a communication system of an embodiment, a general configuration of a communication system having a high data rate to which the present invention is applied is explained.

Figure 1A:
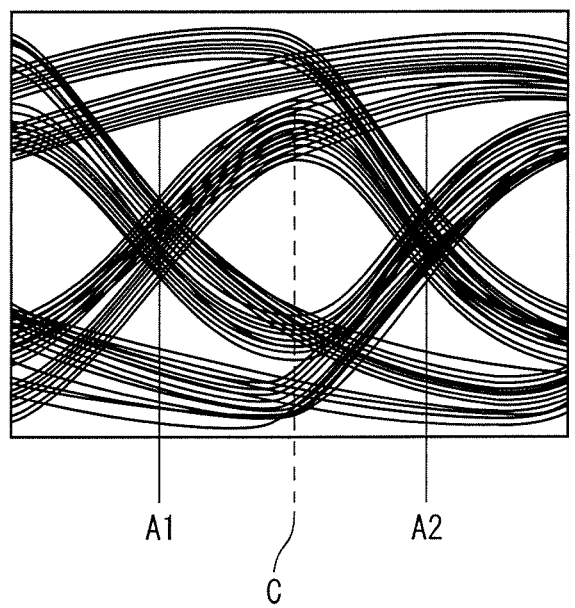
FIG. 1A is a diagram illustrating an example of waveforms of differential data signals input to the reception circuit from the transmission line (lane)

FIG. 1A is a diagram illustrating an example of waveforms of differential data signals input to the reception circuit from the transmission line (lane).

FIG. 1A is a diagram generally called an eye-opening (eye pattern). The reception circuit receives such data signals as reception data and takes in after performing 0/1 determination.

In FIG. 1A, phases denoted by A1 and A2 indicate transition timing at which the differential data signals cross at the intermediate level and the phase is called a boundary phase. Symbol C denotes the intermediate phase of the adjacent boundary phases, i.e., a phase shifted from the boundary phase by ½ UI (unit interval). In general, the received data is taken in by always detecting the boundary phase, generating a clock that changes at the phase denoted by C shifted by ½ UI from the boundary phase, and latching the data at the clock.

In order to perform data communication normally, it is necessary to set a taking-in threshold value to the level within the eye-opening and to determine data at the timing within the eye-opening. As the data rate increases, the eye-opening becomes narrower and determination of data becomes difficult accordingly. Because of this, an eye-opening monitor for detecting quality, such as the size of the eye-opening, is provided in the reception circuit and the quality of the eye-opening is evaluated.

In order to detect the quality of the eye-opening, the signal level is detected while shifting the phase from the boundary phase to the next boundary phase little by little. The signal level is detected by a voltage sweep that changes a threshold value of a latch to take in received data, but in order to perform this, a complicated detection circuit and a long detection time are required. Because of this, in general, the signal level is detected by transmitting an already-known pseudo random data pattern and performing taking-in of the received data a number of times to find a bit error rate (BER).

Figure 1B:
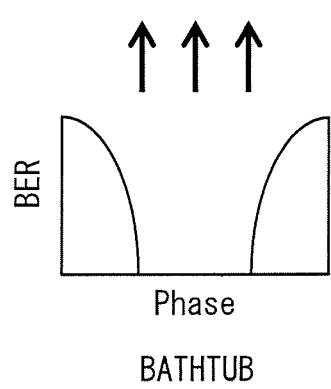
FIG. 1B is a diagram illustrating a graph of a distribution of a bit error rate (BER) in one clock cycle.

FIG. 1B is a diagram illustrating a graph of a distribution of a bit error rate (BER) in one clock cycle.

In FIG. 1B, the horizontal axis represents the deviation of phase from the boundary phase (Phase) and the vertical axis represents the BER. This graph is called a bathtub curve and it is common to evaluate the quality of the eye-opening in the range and at the level in the center part of the bathtub curve. Because of this, the eye-opening monitor has a function to perform a sweep that gradually changes the phase between the boundary phases.

An attempt is made to improve the data rate in serial communication, however, it is difficult to improve the data rate greatly. Because of this, a communication system has been examined, which improves the data communication rate by providing a plurality of lanes through which communication is performed at a data rate resembling the above-mentioned data rate and by performing parallel data communication. In this communication system, the communication rate, which is the data rate of each lane multiplied by the number of lanes, is obtained, and therefore, the communication rate improves greatly.

Figure 2:
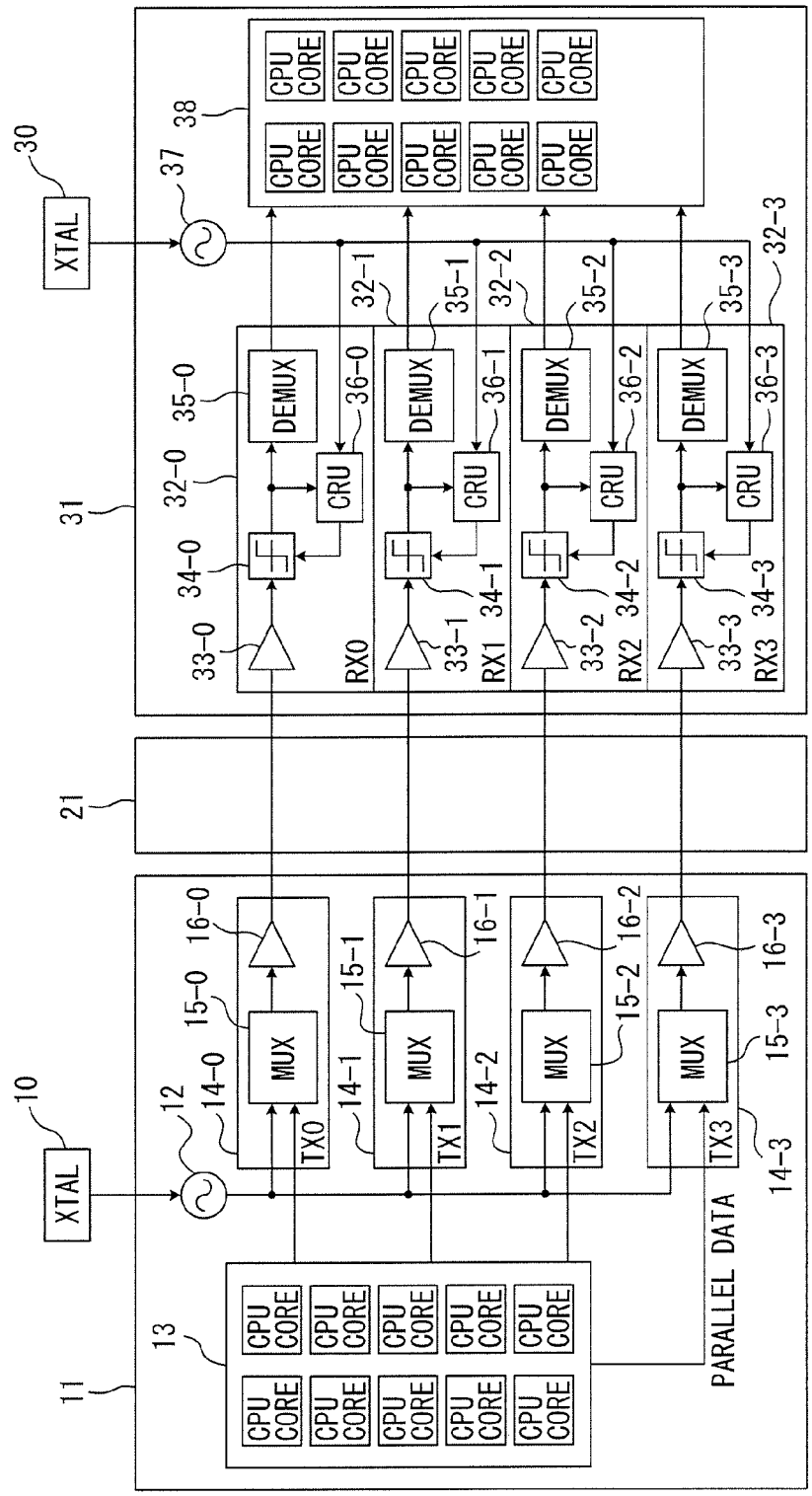
FIG. 2 is a block diagram illustrating an outline configuration of a communication system having a plurality of lanes (here, four lanes)

FIG. 2 is a block diagram illustrating an outline configuration of a communication system having a plurality of lanes (here, four lanes).

This communication system has a transmitter 11, a communication path 12, and a receiver 31. The transmitter 11 is a first processing unit (first CPU) provided within the device, the receiver 31 is a second processing unit (second CPU) provided within the device, and the communication path 21 has a plurality of wires (lanes) provided on a printed board etc. There is also a case where the communication system in FIG. 2 is provided within an integrated circuit or a case where the communication system is provided in a different casing. For example, the transmitter 11 multiplexes 32-bit data into four-bit data and transmits the 32-bit data as four-bit parallel data. The receiver 31 receives the four-bit parallel data and de-multiplexes the four-bit parallel data to generate 32-bit data.

On the transmitter 11 side, a transmission clock source 10 is provided and on the receiver 31 side, a reception clock source 30 is provided. A PLL circuit 12 within the transmitter 11 generates a transmission clock from a clock supplied from the transmission clock source 10. A PLL circuit 37 within the receiver 31 generates a transmission clock from a clock supplied from the transmission clock source 10. The transmission clock and the reception clock have similar oscillation frequencies, but they do not agree perfectly with each other and the phases deviate gradually. There is also a case where the clock source is provided only on the transmitter 11 side and the transmission clock or the divided clock thereof is transmitted to the reception circuit, and in the PLL of the reception circuit, the reception clock is generated from the transmitted clock.

The transmitter (first CPU) 11 has the above-described PLL 12, a core part 13 having a plurality of CPUs, and four transmission circuits (TX 0 to TX 3) 14-0 to 14-3. The four transmission circuits 14-0 to 14-3 have respective multiplexers (MUXs) 15-0 to 15-3 and respective drivers 16-0 to 16-3. The four transmission circuits 14-0 to 14-3 respectively multiplex the data generated in the core part 13 and output four-bit parallel data to four lanes of the transmission line 21.

The receiver (second CPU) 31 has the above-described PLL 37, four reception circuits (RX 0 to RX 3) 32-0 to 32-3, and a core part 38 having a plurality of CPUs. The four reception circuits 32-0 to 32-3 have respective input amplifiers 33-0 to 33-3, respective latch circuits 34-0 to 34-3, respective de-multiplexers (DEMUXs) 35-0 to 35-3, and respective CRUs 36-0 to 36-3. The four transmission circuits 14-0 to 14-3 receive four-bit parallel data from the four lanes and de-multiplex the received data, and then output the de-multiplexed data to the core part 38. Each of the CRUs 36-0 to 36-3 tracks the boundary phase of the taken-in data and adjusts the phase of the common reception clock supplied from the PLL 37 so as to take in the input data at the timing denoted by C in FIG. 1, and then supply the phase-adjusted reception clock to the each of the latch circuits 34-0 to 34-3. The characteristics of the path including the transmitter, the lane, and the receiver change from lane to lane, and therefore, the CRUs 36-0 to 36-3 are provided in the four reception circuits 32-0 to 32-3, respectively, and the boundary phase is tracked for each reception circuit.

FIG. 3A is a block diagram illustrating a circuit configuration of the CRU that performs CDR (Clock Data Recovery) and FIG. 3B to FIG. 3E are time charts explaining the operation of the circuit in FIG. 3A.

The CRU 36 has a phase detector (PD) 41, buffers 42 and 43, an adder 44, a register (REG) 45, an adder 46, a register (REG) 47, a phase shifter 48, and a boundary latch circuit 39. Because of schematic representation, the CRU 36 is illustrated so as not to be included in the boundary latch circuit 39, but it is assumed that the CRU 36 is actually included therein.

To the data latch circuit 34 and the boundary latch circuit 39, clocks 180° different in phase output from the phase shifter 48 are supplied and the input data is latched. Consequently, here, 2×oversampling to latch input data in one period of the reception clock is performed.

As illustrated in FIG. 3B, in the ideal state, a clock (0°) that rises at the timing indicated by the solid line is supplied to the data latch circuit 34 and a clock (180°) that rises at the timing indicated by the broken line is supplied to the boundary latch circuit 39. When following of the CDR deviates, as illustrated in FIG. 3C, the state deviates from the ideal state and if input data is latched at this clock, correct input data is not taken in.

As illustrated in FIG. 3D, when the state delays from the ideal state, the sequence of the first data latched by the data latch circuit 34, the next second data latched by the boundary latch circuit 39, and the further next third data latched by the data latch circuit 34 will be "011". If the next data latched by the boundary latch circuit 39 is skipped and similarly the sequence of the first to third data is latched, the sequence will be "011". If the EXOR of the adjacent data is calculated, the result will be "100".

As illustrated in FIG. 3E, when the state advances from the ideal state, the sequence of the first data latched by the data latch circuit 34, the next second data latched by the boundary latch circuit 39, and the further next third data latched by the data latch circuit 34 will be "110". If the next data latched by the boundary latch circuit 39 is skipped and similarly the sequence of the first to third data is latched, the sequence will be "110". If the EXOR of the adjacent data is calculated, the result will be "001".

As described above, by performing a logic operation of the values latched serially by the data latch circuit 34 and the boundary latch circuit 39, whether the state is delayed or advanced from the ideal state is made clear.

The PD 41 performs the above-described operation processing on the data output from the data latch circuit 34 and the boundary latch circuit 39, determines whether the state is delayed or advanced from the ideal state, and outputs a signal corresponding to the state.

To the adder 44, the output of the REG 45 is fed back and added and thus an integrator is formed. By adding a value, which is the output data of the PD 41 indicating whether or not the state is delayed or advanced multiplied by a coefficient G1, to the integrator, the integrator functions as a frequency tracking integrator.

To the adder 46, the output of the REG 47 is fed back and added and thus an integrator is formed. By adding the data indicating the frequency difference output from the REG 45 and a value obtained by multiplying the output data of the PD 41 by a coefficient G2, the integrator functions as a phase number tracking integrator and generates a phase code to follow the boundaries and the middle thereof.

The phase shifter 48 generates an adjusted clock that follows the boundaries and the middle thereof by shifting the reception clock by an amount corresponding to the phase code and supplies the adjusted clock to the data latch circuit 34 and the boundary latch circuit 39. The adjusted clock supplied to the data latch circuit 34 is a clock that rises in the middle of the boundaries and the adjusted clock supplied to the boundary latch circuit 39 is a clock that rises at the boundaries and the phases deviate 180° from each other.

As described above, the CDR function to follow the boundaries from the received data and to take in input data in the middle of the boundaries is implemented. The CRU is widely known, and therefore, more explanation is omitted.

Figure 4A:
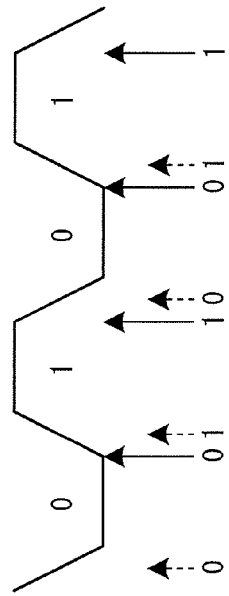
FIG. 4C is a block diagram illustrating a configuration of a reception circuit that implements the eye-opening monitoring function by using the CRU that performs the CDR function at the time of the normal operation.
Figure 4B:
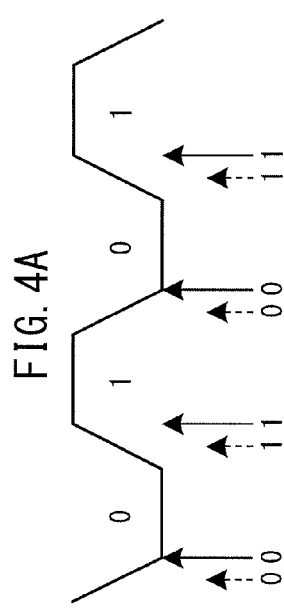

FIG. 4A and FIG. 4B are diagrams explaining the sweep operation of the eye-opening monitoring function.

As described previously, in order to implement the eye-opening monitoring function, while following the boundaries of the input data by the CDR function, the input data is taken in by changing the phase to be shifted with respect to the boundaries, and then, the BER (bit error rate) thereof is calculated. The calculation of BER requires a number of times of taking-in of input data.

In FIG. 4A, the broken line arrow indicates the boundary and the solid line arrow indicates the timing to take in input data in the phase slightly advanced from the boundary. FIG. 4B illustrates the timing to take in input data in the phase considerably advanced from the boundary. From the state in FIG. 4A until the state in FIG. 4B is reached, while the phase indicated by the solid line arrow is changed gradually, the BER is calculated.

In order to implement the eye-opening monitoring function, it can be considered to provide one more set of the data latch circuit, the boundary latch circuit, and the CRU in each reception circuit and to shift the phase of the adjusted clock to be supplied to the data latch circuit. However, the CRU is a large-scale circuit and the hardware cost becomes high, and therefore, this idea is difficult to put into practice.

Because of this, it is considered to use the CRU that performs the CDR function at the time of the normal operation because the normal reception operation is not performed at the time of the eye-opening monitoring.

Figure 4C:
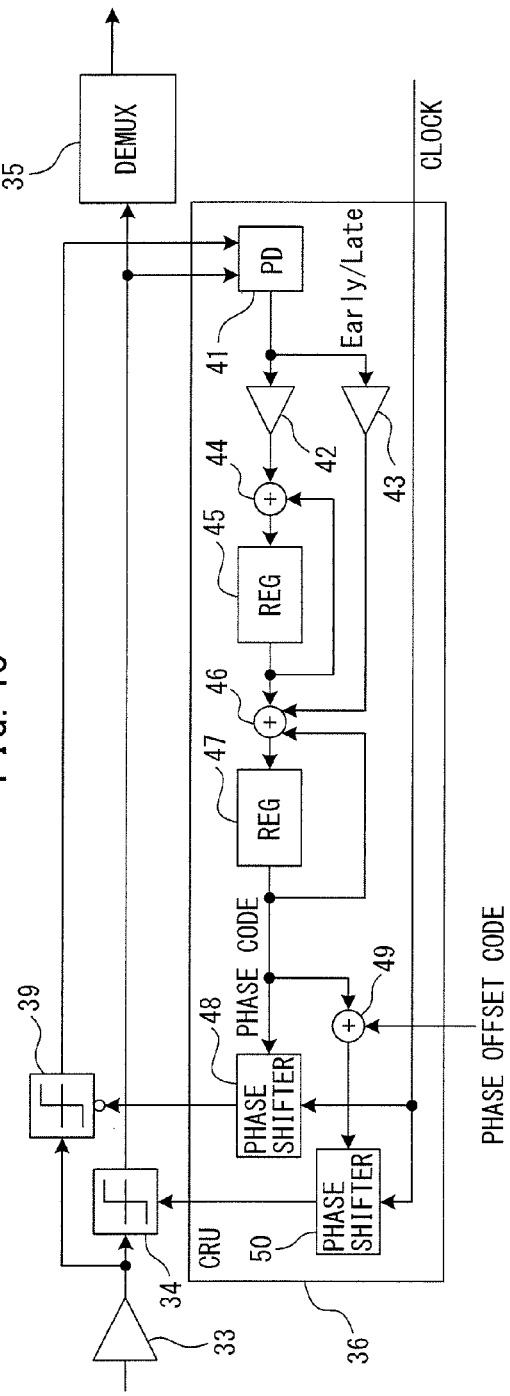

FIG. 4C is a block diagram illustrating a configuration of a reception circuit that implements the eye-opening monitoring function by using the CRU that performs the CDR function at the time of the normal operation. As illustrated schematically, the configuration is the same as that in FIG. 3A except in that an adder 49 and a phase shifter 50 are added.

The adder 49 adds the phase code output from the REG 47 and the phase offset code input from the outside (e.g., either of the CPUs of the core part 38) and outputs the result to the phase shifter 50. The phase shifter 50 generates an adjusted clock, which is the reception clock shifted by the amount corresponding to the code output from the adder 49, i.e., shifted by the amount corresponding to the sum of the phase code and the phase offset code, and supplies the adjusted clock to the data latch circuit 34. By changing the phase offset code, it is possible to cause the data latch circuit 34 to take in data in any phase while following the boundary.

As described above, by adding the phase shifter, it is possible to implement the eye-opening monitoring function by using the CRU, but if the phase shift is mounted additionally, the hardware cost becomes high and there is a possibility that it is not possible to correctly perform the eye-opening monitoring due to variations in the two phase shifters. Further, there is a possibility that the CDR function itself deteriorates due to the variations even at the time of the normal operation.

It is desired to implement a communication system having a plurality of lanes, a plurality of transmission circuits, and a plurality of reception circuits, and in which each reception circuit has the CDR function and the eye-opening monitoring function, and which performs parallel data communication at a high data rate, and a receiver while suppressing an increase in the circuit scale.

Hereinafter, embodiments will be explained.

A communication system of a first embodiment has the same configuration as that of the communication system illustrated in FIG. 2 except in that the configurations of the CRUs 36-0 to 36-3 of the plurality of the reception circuits 32-0 to 32-3 of the receiver 31 are different and a BERT is provided.

Figure 5:
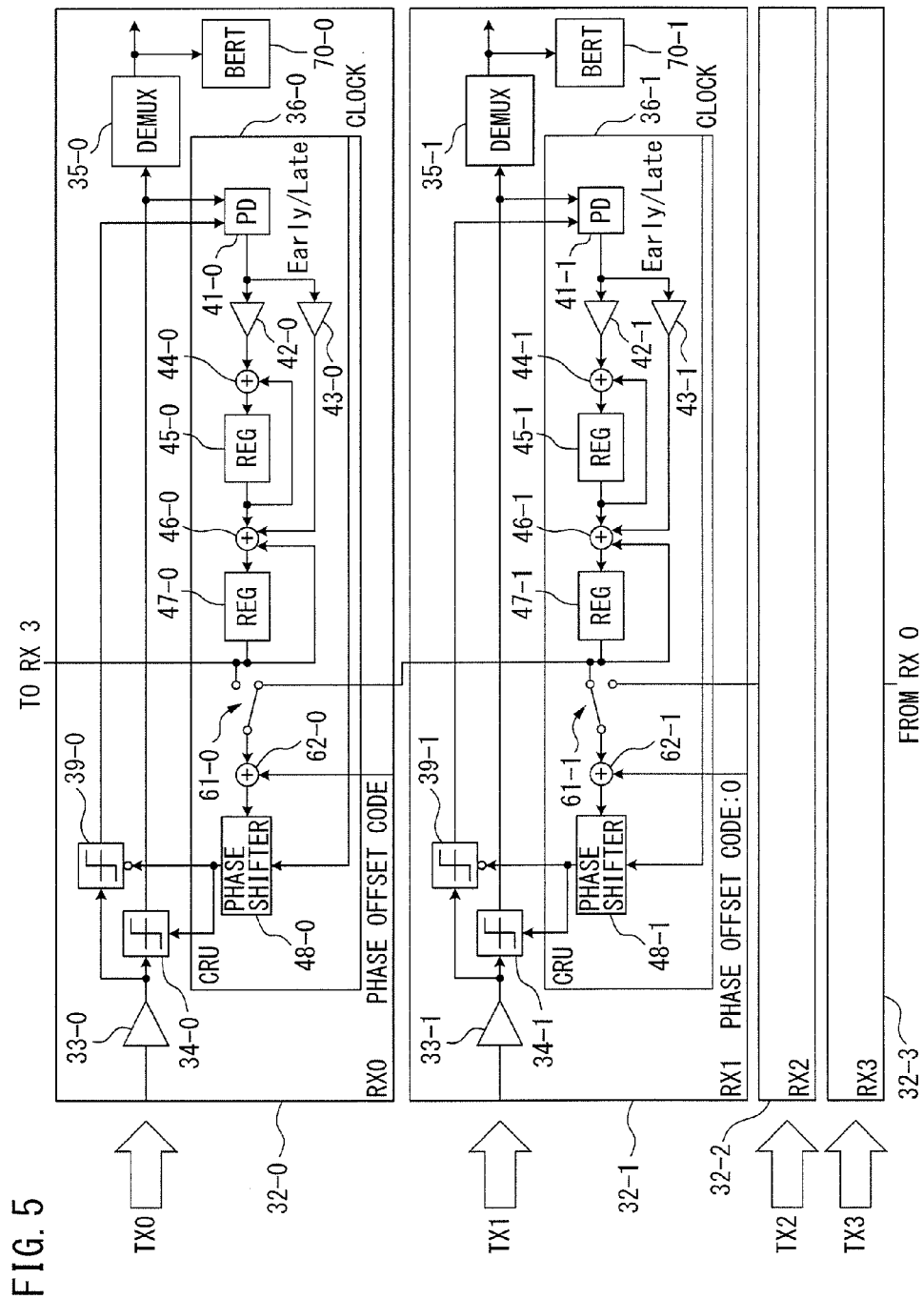
FIG. 5 is a block diagram illustrating a configuration of a receiver of the first embodiment.

FIG. 5 is a block diagram illustrating a configuration of a receiver of the first embodiment.

The receiver of the first embodiment has a plurality of the reception circuits 32-0 to 32-3. The respective reception circuits 32-0 and 32-1 have the respective input amplifiers 33-0 and 33-1, the respective data latch circuits 34-0 and 34-1, the respective DEMUXs 35-0 and 35-1, the respective CRUs 36-0 and 36-1, and respective BERTs 70-0 and 70-1. Each of the BERTs 70-0 and 70-1 calculates a bit error rate (BER) at the time of the eye-opening monitoring. The BERT is known, and therefore, explanation is omitted.

As in FIG. 3A, the respective CRUs 36-0 and 36-1 have respective PDs 41-0 and 41-1, respective buffers 42-0 and 42-1 and respective buffers 43-0 and 43-1, respective adders 44-0 and 44-1, and respective REGs 45-0 and 45-1. Further, the CRUs 36-0 and 36-1 have respective adders 46-0 and 46-1, respective REGs 47-0 and 47-1, respective switches 61-0 and 61-1, respective adders 62-0 and 62-1, and respective phase shifters 48-0 and 48-1. Furthermore, the CRUs 36-0 and 36-1 also include boundary latch circuits 39-0 and 39-1, respectively. Consequently, the configurations of the CRUs 36-0 and 36-1 of the first embodiment differ from the configurations in FIG. 3A in that the switches 61-0 and 61-1 and the adders 62-0 and 62-1 are added and others are the same. Although not illustrated schematically, the reception circuits 32-2 and 32-3 also have the same configurations as those of the reception circuits 32-0 and 32-1, respectively.

The phase code (phase code of the RX 1) output from the REG 47-1 of the CRU 36-1 is input to one terminal of the switch 61-0 of the CRU 36-0. The switch 61-0 of the CRU 36-0 selects one of the phase code (phase code of the RX 0) output from the REG 47-0 and the phase code (phase code of the RX 1) output from the REG 47-1 of the CRU 36-1. The adder 62-0 adds the phase offset code to the phase code selected by the switch 61-0 and outputs the result to the phase shifter 48-0. The phase shifter 48-0 shifts the reception clock from the PLL 37 by the amount corresponding to the phase code output from the adder 62-0 and supplies the shifted reception clock to the data latch circuit 34-0 and the boundary latch circuit 39-0.

The switch 61-0 selects the phase code (phase code of the RX 0) output from the REG 47-0 at the time of the normal operation and selects the phase code (phase code of the RX 1) output from the REG 47-1 of the CRU 36-1 at the time of the eye-opening monitoring of the reception circuit 32-0. Consequently, at the time of the normal operation, the CDR function explained in FIG. 3A is implemented. On the other hand, at the time of the eye-opening monitoring, the reception circuit 32-1 is operating normally and the phase code of the RX 1 is the code that follows the boundary of the input data of the reception circuit 32-1. Consequently, the CRU 36-0 follows the boundary in accordance with the phase code of the RX 1 and at the same time, by changing the phase offset code, supplies an adjusted clock that rises in any phase with respect to the boundary to the data latch circuit 34-0. In response to this, the data latch circuit 34-0 latches input data to be input to the reception circuit 32-0 in any phase. By performing this a number of times to calculate the BER and by sweeping the phase by changing the phase offset code, it is possible to monitor the eye-opening of the reception circuit 32-0. At the time of the eye-opening monitoring, the data latched by the boundary latch circuit 39-0 is not used in the CDR, and therefore, any clock may be supplied from the phase shifter 48-0 to the boundary latch circuit 39-0. In other words, the phase shifter 48-0 may generate a clock to be supplied to the boundary latch circuit 39-0 in the same manner as that at the time of the normal operation in accordance with the phase code output from the adder 62-0.

As illustrated in FIG. 1, on the transmission side, the clock source (e.g., crystal oscillator) 10 is provided and on the reception side, the clock source 30 is provided, respectively, and the PLL 12 generates a transmission clock and the PLL 37 generates a reception clock. The oscillation frequency of the clock source 10 is not exactly the same as that of the clock source 30 and in general, the PLL has phase noise or fluctuations in frequency. However, the four transmission circuits 14-0 to 14-3 operate with the same fluctuations and the four reception circuits 32-0 to 32-3 also operate with the same fluctuations. In other words, the clock component of the TX 1 extracted in the reception circuit 32-1 (RX 1) is equal to the clock component of the TX 0 extracted in the reception circuit 32-0 (RX 0). In the first embodiment, this is utilized and by transferring the phase code generated by the CRU 36-1 of the RX 1 to the RX 0 and by adding the offset to the phase code, the RX 0 measures the eye-opening while following (performing CDR of) the operation of the TX 0.

To one terminal of the switch 61-1 of the CRU 36-1, the phase code (phase code of the RX 2) of the CRU 36-2 is input. At the time of the eye-opening monitoring of the reception circuit 32-1, the reception circuit 32-2 is operating normally and the switch 61-1 selects the phase code (phase code of the RX 2) of the CRU 36-2. Consequently, the CRU 36-1 follows the boundary in accordance with the phase code of the RX 2 and at the same time, by changing the phase offset code, supplies an adjusted clock that rises in any phase with respect to the boundary to the data latch circuit 34-1. In response to this, the data latch circuit 34-1 latches input data to be input to the reception circuit 32-1 in any phase. By performing this, a number of times to calculate the BER and by sweeping the phase by changing the phase offset code, it is possible to monitor the eye-opening of the reception circuit 32-1. The above operation is the same also in the reception circuits 32-2 and 32-3, and the reception circuit 32-2 receives the supply of the phase code of the RX 3 at the time of the eye-opening monitoring and the reception circuit 32-3 receives the supply of the phase code of the RX 0 at the time of the eye-opening monitoring.

In the first embodiment in FIG. 5, the reception circuit 32-0 receives the supply of the phase code of the RX 1 from the reception circuit 32-1 at the time of the eye-opening monitoring and the reception circuit 32-1 receives the supply of the phase code of the RX 2 from the reception circuit 32-2 at the time of the eye-opening monitoring. Further, the reception circuit 32-2 receives the supply of the phase code of the RX 3 from the reception circuit 32-3 at the time of the eye-opening monitoring and the reception circuit 32-3 receives the supply of the phase code of the RX 0 from the reception circuit 32-0 at the time of the eye-opening monitoring. The eye-opening monitoring operation of the reception circuit 32-2 may be performed sequentially one by one, but it takes a long time to complete the eye-opening monitoring operation of all the reception circuit. Because of this, when performing the eye-opening monitoring operation of the even-numbered reception circuits 32-0 and 32-2, the odd-numbered reception circuits 32-1 and 32-3 are caused to operate normally. Then, when performing the eye-opening monitoring operation of the odd-numbered reception circuits 32-1 and 32-3, the even-numbered reception circuits 32-0 and 32-2 are caused to operate normally. Due to this, it is possible to perform the eye-opening monitoring of the two reception circuits at the same time and it is only required to perform the eye-opening monitoring operation twice. This is the same even if the number of lanes increases and by performing the eye-opening monitoring operation twice, the eye-opening monitoring operation of all the reception circuits is completed. In this case, it is only required to supply the same phase offset code commonly to the reception circuits of which the eye-opening monitoring operation is being performed.

In the first embodiment, the CRU of one of the plurality of reception circuits receives the supply of the phase code from another reception circuit operating normally at the time of the eye-opening monitoring. For this relationship, there can be various kinds of modified examples. Hereinafter, modified examples are explained.

Figure 6:
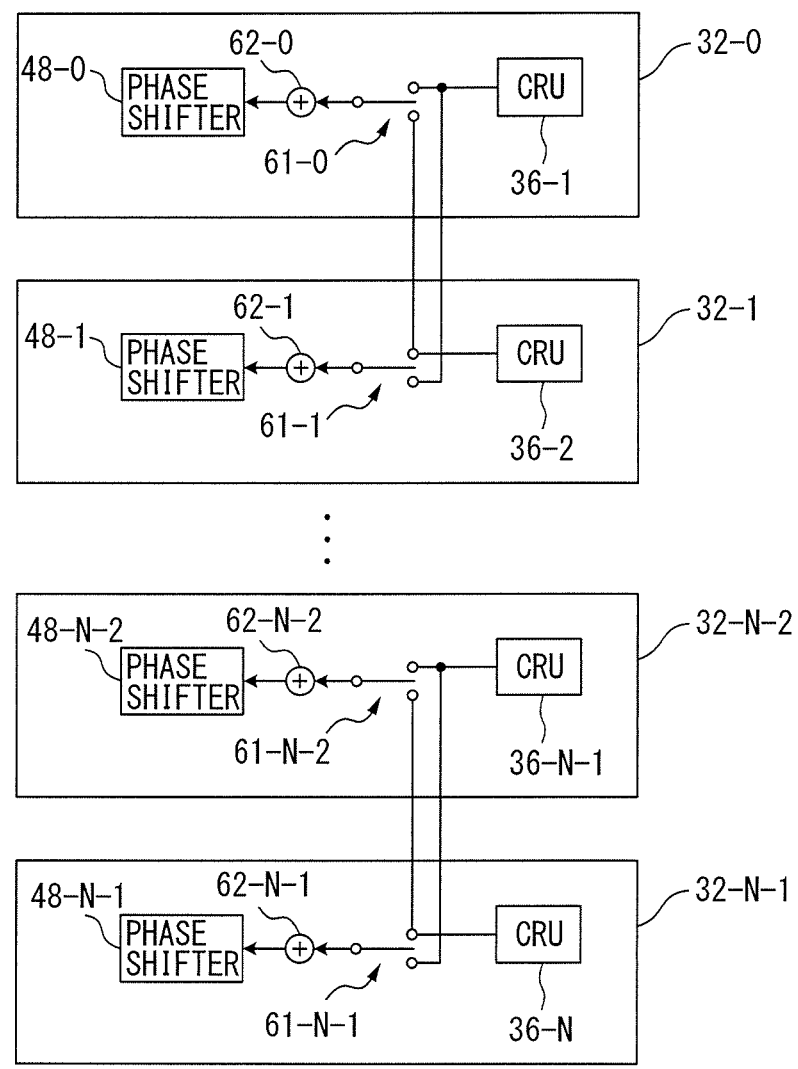
FIG. 6 is a diagram illustrating one modified example of the supply relationship of phase code among a plurality of reception circuits.

FIG. 6 is a diagram illustrating one modified example of the supply relationship of phase code among a plurality of reception circuits.

In the modified example in FIG. 6, the N reception circuits 32-0 to 32-N−1 are provided, and the adjacent two reception circuits are combined into a set and the phase code (clock information) is supplied to each other between the two reception circuits of each set. In this modified example, the signal line through which the phase code is supplied is only required to be provided between the reception circuits physically adjacent to each other, and therefore, it is possible to reduce the length of the signal line.

The execution sequence of the eye-opening monitoring operation in the modified example in FIG. 6 is the same as that in the case in FIG. 5: one of the set is brought into the eye-opening monitoring operation state and the other into the normal operation state and the eye-opening monitoring operation of the one of the set is performed. Next, the other is brought into the eye-opening monitoring operation state and the one of the set into the normal operation state, and then the eye-opening monitoring operation of the other is performed, thereby the eye-opening monitoring operation of all the reception circuits is completed by performing the eye-opening monitoring operation twice.

Figure 7:
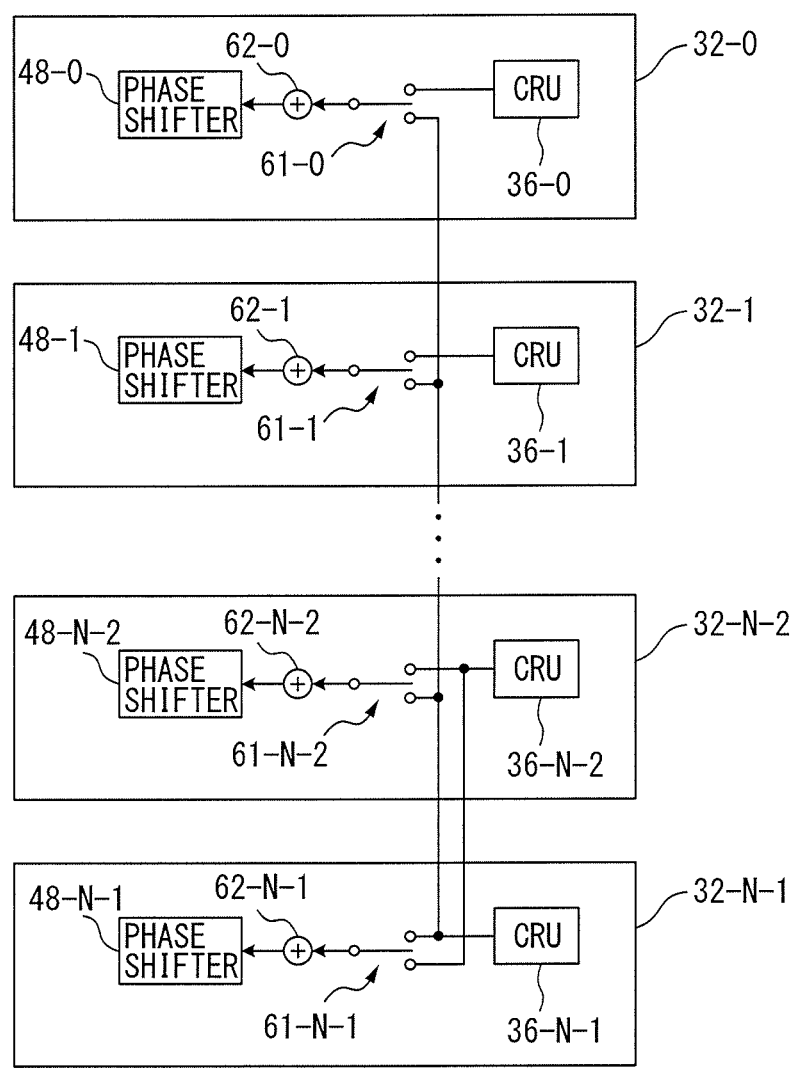
FIG. 7 is a diagram illustrating another modified example of the supply relationship of phase code among a plurality of reception circuits.

FIG. 7 is a diagram illustrating another modified example of the supply relationship of phase code among a plurality of reception circuits.

In another modified example in FIG. 7, from one of the N reception circuits 32-0 to 32-N-1 (here, reception circuit 32-N-1), the phase code (clock information) is supplied to the remaining (N-1) reception circuits 32-0 to 32-N-2. Then, from one of the remaining (N-1) reception circuits 32-0 to 32-N-2 (here, reception circuit 32-N-2), the phase code (clock information) is supplied to the reception circuit 32-N-1.

The execution sequence of the eye-opening monitoring operation in another modified example in FIG. 7 is the same as that in the case in FIG. 5. The reception circuits 32-0 to 32-N-2 are brought into the eye-opening monitoring operation state and the reception circuit 32-N-1 into the normal operation state and then the eye-opening monitoring operation of the reception circuits 32-0 to 32-N-2 is performed. Next, the reception circuit 32-N-1 is brought into the eye-opening monitoring operation state and the reception circuits 32-0 to 32-N-2 into the normal operation state and then the eye-opening monitoring operation of the reception circuit 32-N-1 is performed. In this manner, the eye-opening monitoring operation of all the reception circuits is completed by performing the eye-opening monitoring operation twice.

FIG. 8 is a block diagram illustrating a configuration of a receiver of a second embodiment.

The communication system of the second embodiment has the same configuration as that of the communication system of the first embodiment except in that switches 81-0 to 81-3 for switching paths of input data are provided at the input portion of the receiver 31.

By the switches 81-0 to 81-3 provided at the inlets of the reception circuits 32-0 to 32-3, respectively, it is possible to make selection so that the transmission data is input to the reception circuit 32-0 from one of the TX 0, the TX 1, and the TX 3. Similarly, it is possible to make selection so that the transmission data of the TX 0, the TX 1, and the TX 2 is input to the reception circuit 32-1, the transmission data of the TX 1, the TX 2, and the TX 3 is input to the reception circuit 32-2, and the transmission data of the TX 2, the TX 3, and the TX 0 is input to the reception circuit 32-3.

For example, as illustrated in FIG. 8, the switch 81-0 is set so that the same input data as that of the reception circuit 32-0 is input to the reception circuit 32-1 at the time of the eye-opening monitoring operation of the reception circuit 32-0. Due to this, the reception circuit 32-1 generates a following phase code by using the same input data as the input data to be input to the reception circuit 32-0 and by using the clock extraction function of the CRU 36-1, and then supplies the following phase code to the reception circuit 32-0. Consequently, the reception circuit 32-0 performs the eye-opening monitoring operation by using the input data transmitted through the same lane used at the time of the actual operation, and therefore, more accurate eye-opening monitoring is enabled. The above also applies to the other reception circuits 32-1 to 32-3.

However, to be strict, the wire lengths (electrical lengths) of the two lanes from the TX 0 to the RX 0 and from the TX 1 to the RX 1 are never the same, and therefore, there is a phase difference between the data input to the RX 0 and the RX 1. However, the function itself of the eye-opening monitoring sweeps the phase and measures the BER, and therefore, this phase difference does not bring about any problem.

As described above, in the eye-opening monitoring, the BER of the input data is measured, but in the case where the BER of a small value is measured, long-time measurement is necessary. For example, in the case where $BER=10^{-15}$ is measured with an interface of 10 Gbps, 100,000 seconds are necessary. Between the transmitter and the receiver, transmission lines configured by a package, PCB (printed circuit board), etc., exist and the transmission delay characteristics of which vary depending on the temperature at that time. This means that the phases of the signal input to the RX 0 and the signal input to the RX 1 vary depending on time. Due to this, even while the BER is being measured by using the same offset code, it can be considered that the phase deviates from the phase in which it is desired to acquire the input signal, and therefore, it is not possible to measure the correct eye-opening.

Figure 9B:
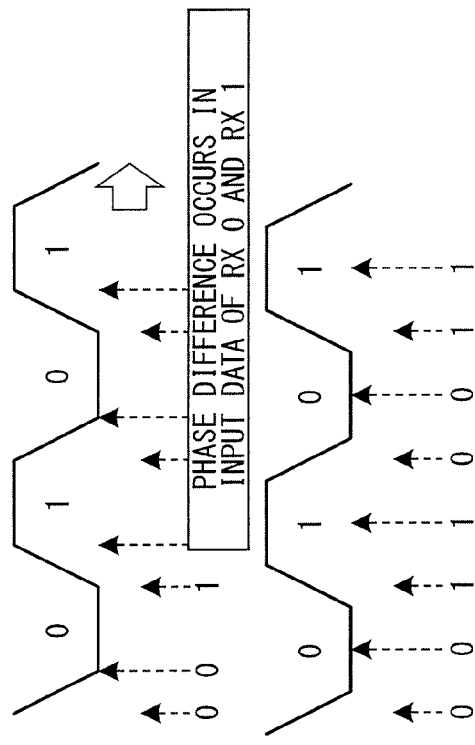
FIG. 9A and FIG. 9B are diagrams explaining the occurrence of a deviation of phase between the RX 0 and the RX 1 as time elapses.
Figure 9A:
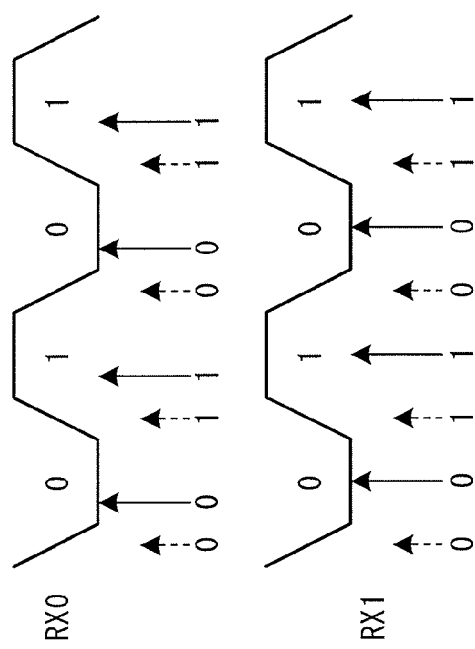

FIG. 9A and FIG. 9B are diagrams explaining the occurrence of a deviation of phase between the RX 0 and the RX 1 as time elapses: FIG. 9A illustrates an example of the initial phase relationships between the data latch clock and the boundary latch clock in the RX 0 and the RX 1, and FIG. 9B illustrates an example after a long time elapses.

As illustrated in FIG. 9A, in the RX 0 and the RX 1, the phase of the boundary latch clock is the same and in the RX 1, the data latch clock is located in the middle of the adjacent boundary latch clocks (180° advanced). In the RX 0, the data latch clock is about 100° advanced from the boundary latch clock. The data latch clock in the RX 0 sweeps, but is fixed while the BER in one phase is being measured.

As described above, the phase deviates due to various kinds of variation factors, but by the CDR function, in the RX 1, the boundary latch clock indicates the boundary and the data latch clock is 180° advanced. On the other hand, in the RX 0, the CDR function does not work, and therefore, a deviation occurs and as illustrated schematically, both the boundary latch clock and the data latch clock are delayed. As described above, the boundary latch clock is not used, and therefore, no problem arises even if the boundary latch clock is delayed. However, if the data latch clock is delayed, the phase in which data is taken in (sampling phase) changes and it is no longer possible to measure the correct BER.

Figure 10:
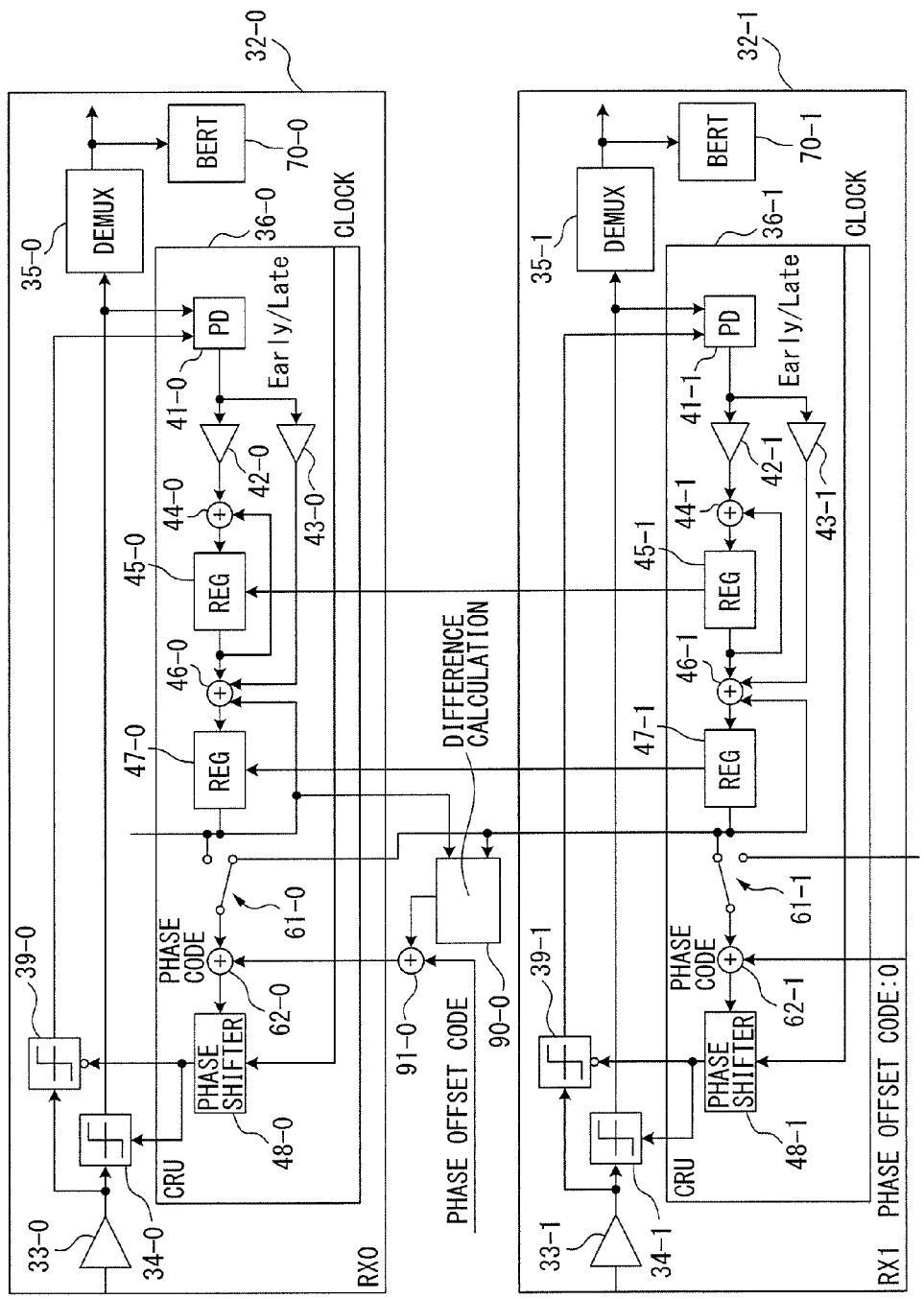
FIG. 10 is a block diagram illustrating a configuration of a receiver of a third embodiment.

FIG. 10 is a block diagram illustrating a configuration of a receiver of a third embodiment.

The communication system of the third embodiment has the same configuration as the communication system of the first embodiment except in that difference calculation units 90-0 to 90-3 and adders 91-0 to 91-3 are provided in correspondence to the reception circuits 32-0 to 32-3 in the receiver 31. Further, the communication system is designed so that it is possible for REGs 45-0 and 47-0 of the reception circuit 32-0 to copy data held by the REGs 45-1 and 47-1 of the reception circuit 32-1. This also applies to the other reception circuits and the reception circuit 32-1 copies the reception circuit 32-2, the reception circuit 32-2 copies the reception circuit 32-3, and the reception circuit 32-3 copies the reception circuit 32-0. The rest is the same as that in the first embodiment. Because of the limit to schematic representation, in FIG. 10, the reception circuits 32-0 and 32-1, the difference calculation unit 90-9, and the adder 91-0 are illustrated and others are not illustrated schematically. In FIG. 10, the difference calculation unit 90-0 and the adder 91-0 are provided outside the reception circuit 32-0, but actually they are provided in correspondence to the reception circuit 32-0 and included in the reception circuit 32-0.

The difference calculation unit 90-0 calculates and holds the difference between the phase code output from the REG 47-0 and the phase code output from the REG 47-1 when the reception circuits 32-0 and 32-1 perform the normal operation before the eye-opening monitoring operation of the reception circuit 32-0 is performed. When the eye-opening monitoring operation is performed, the adder 90-0 outputs the sum of the phase offset data and the difference between the phase code output from the REG 47-0 (the phase code of the RX 0) and the phase code output from the REG 47-1 (the phase code of the RX 1) output from the difference calculation unit 90-0. The adder 91-0 is configured so as to output a zero code at the time of the normal operation.

Figure 11:
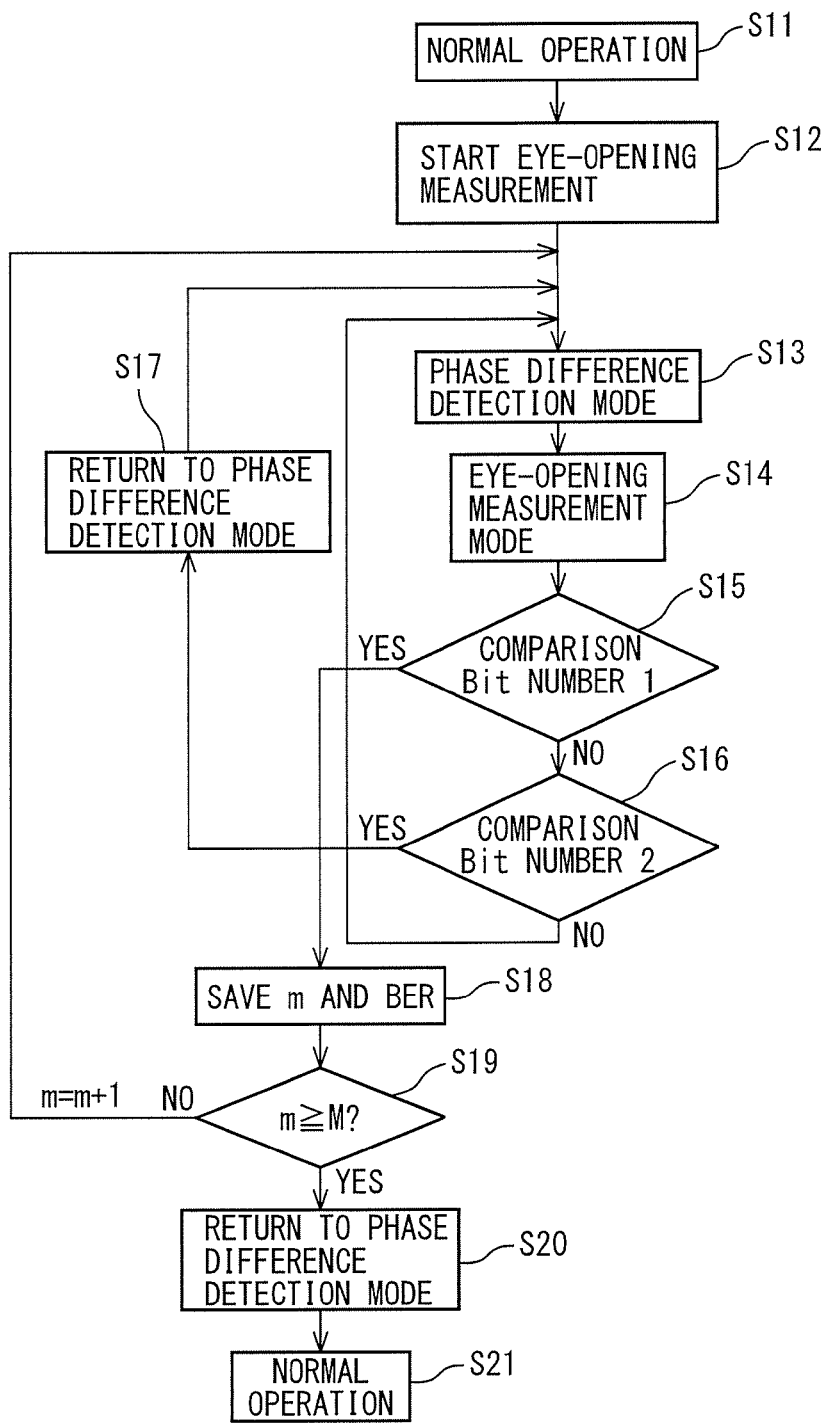
FIG. 11 is a flowchart illustrating the eye-opening monitoring operation in the receiver of the third embodiment.

FIG. 11 is a flowchart illustrating the eye-opening monitoring operation in the receiver of the third embodiment. The reception circuit 32-1 is brought into the normal operation state and then the eye-opening monitoring operation of the reception circuit 32-0 is performed. Here, only the eye-opening monitoring operation of the reception circuit 32-0 is explained, but this is the same also in the case of the eye-opening monitoring operation of the other reception circuits and as explained in the first embodiment, it may also be possible to perform the eye-opening monitoring operation of a plurality of reception circuits at the same time.

Figure 12:
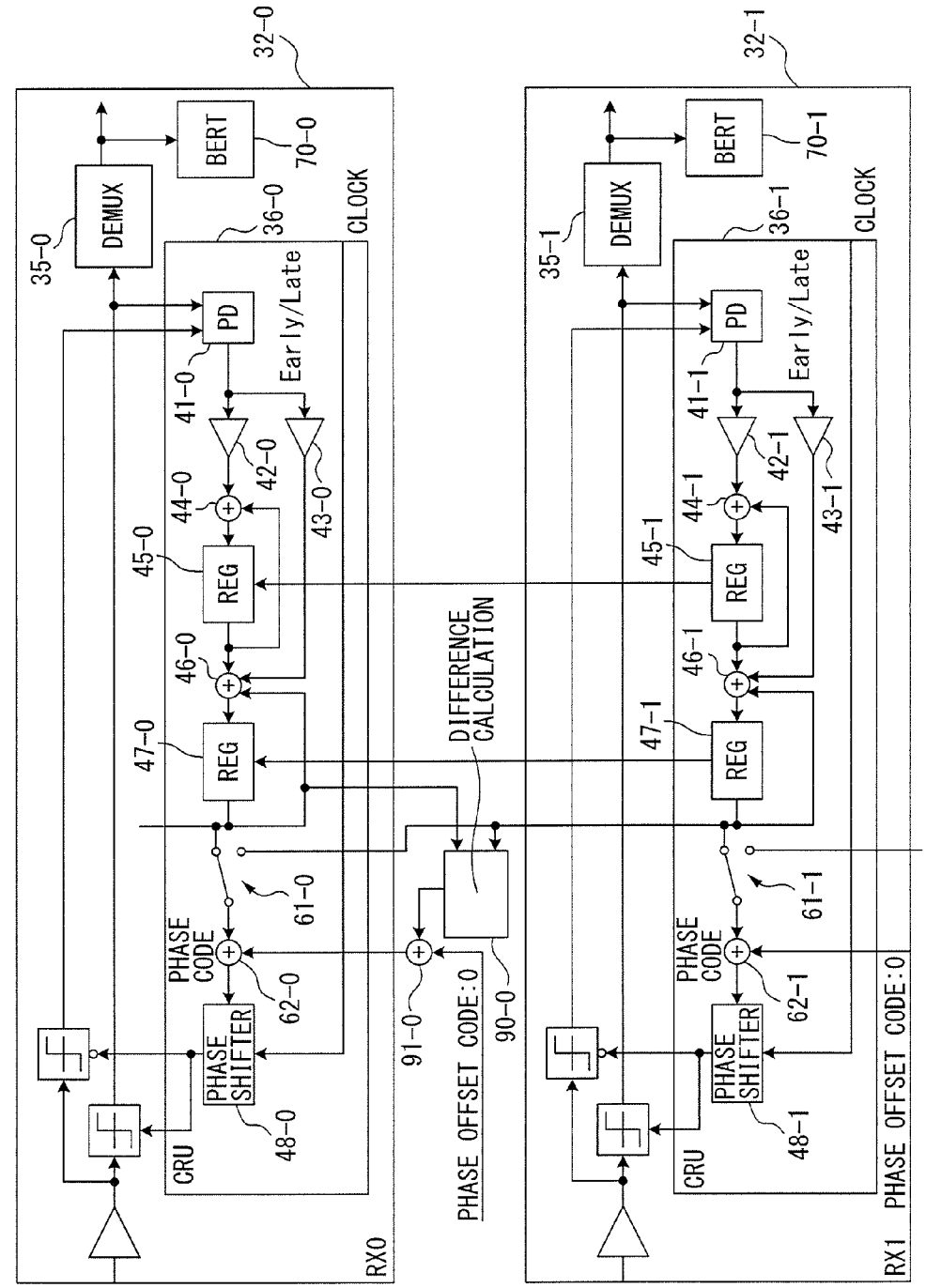
FIG. 12 is a diagram illustrating the states of the operation switches at the time of the phase difference detection mode.

FIG. 12 is a diagram illustrating the states of the operation switch 61-0 of the reception circuit 32-0 and the operation switch 61-1 of the reception circuit 32-1 at the time of the phase difference detection mode. At this time, both the phase offset codes supplied to the reception circuit 32-0 and the reception circuit 32-1 are zero.

At step S11, the normal operation is performed. The normal operation is performed in the state of the switch as illustrated in FIG. 12.

At step S12, the eye-opening measurement (monitoring) is started.

At step S13, the phase difference detection mode is set. In this mode, the state of the switch at the time of the phase difference detection mode is set as illustrated in FIG. 12 and the receiving operation is repeated and the state where the REG 47-0 and the REG 47-1 hold the phase codes is brought about. Then, the difference calculation unit 90-0 calculates the difference between the phase codes held by the REG 47-0 and the REG 47-1 and updates the difference to be held. Further, the phase in which the eye-opening is measured is set. The setting of the phase is done by equally dividing one period into M periods and setting the phase offset code to the code corresponding to the mth phase (m is an integer that satisfies 0<m≤M). The value of m is stored in a register.

At step S14, the eye-opening measurement mode is set. In this mode, the operation switch 61-0 and the operation switch 61-1 are set to the state as illustrated in FIG. 10 and the receiving operation (taking-in of the input data) for measuring the eye-opening (for calculating the BER) of the reception circuit 32-0 is repeated.

At step S15, whether the number of times of the receiving operation (taking-in of the input data) has exceeded a "Comparison Bit number 1" set in advance and which is the number of times sufficient to calculate the BER at the level to be evaluated. If the number 1 is exceeded, the procedure proceeds to step S18 and if the number 1 is not exceeded, the procedure proceeds to step S16.

At step S16, whether the number of times of the receiving operation (taking-in of the input data) being performed continuously has exceeded a "Comparison Bit number 2" set in advance and with which a deviation of phase between the reception circuits 32-0 and 32-1 exceeds a permitted level is determined. If the number 2 is exceeded, the procedure proceeds to step S17 and if the number 2 is not exceeded, the procedure returns to step S13.

At step S17, the state of the switches as illustrate in FIG. 12 is brought about and the phase difference detection mode is returned, and then the procedure proceeds to step S13.

Here, in the eye-opening measurement mode, the CDR function of the reception circuit 32-0 (the RX 0) is in the state where no feedback is provided. Because of this, the output of the PD 42-0 that uses the outputs of the data latch circuit 34-0 and the boundary latch circuit 39-0 becomes unbalanced, and the phase following REG 47-0 and the frequency following REG overflow.

Figure 13:
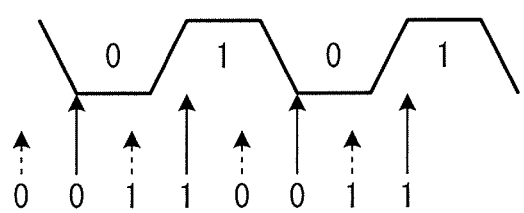
FIG. 13 is a diagram illustrating an example of rise timing of the data latch clock (solid line arrow) and the boundary latch clock (broken line arrow) at the time of return.

FIG. 13 is a diagram illustrating an example of rise timing of the data latch clock (solid line arrow) and the boundary latch clock (broken line arrow) at the time of return. It is necessary to control the rise timing of the boundary latch clock so as to indicate the boundary, but not in FIG. 13.

Consequently, even if the phase difference detection mode is returned in the state in FIG. 13, the CDR function does not work normally and it takes a long time for the CDR function to resume the normal operation. Because of this, at the time of return to the phase difference detection mode, the REGs 45-0 and 47-0 of the reception circuit 32-0 copy the data held by the REGs 45-1 and 47-1 of the reception circuit 32-1. Due to this, convergence by a primary filter is brought about, and therefore, the return to the state where the CDR function works is achieved more quickly.

By the above processing, even in the case where the "Comparison Bit number 1" is larger than the "Comparison Bit number 2" and the number of times the correct receiving operation can be performed continuously does not provide the number of pieces of data necessary for the BER calculation due to a deviation between two reception circuits, it is possible to obtain the necessary number of pieces of data by updating the difference.

Returning to the flowchart in FIG. 11, at step S18, the BER is calculated from the input data obtained by the number of times of the receiving operation exceeding the "Comparison Bit number 1" and is saved in association with m (i.e., the phase in which measurement is performed).

At step S19, whether m is equal to or more than M is determined and if m is less than M, m is incremented by one and the procedure returns to step S13 and if m is equal to or more than M, the procedure proceeds to step S20.

At step S20, the state of the switches as illustrated in FIG. 12 is brought about and the phase difference detection mode is returned, and then, the procedure proceeds to step S13. In the case where the phase difference detection mode is returned, the same operation as that described above is performed.

At step S21, the state where the CRU can follow the input data is brought about and the normal operation is returned.

In the first to third embodiments explained above, in the communication system having a plurality of lanes and in which the CDR function is provided for each reception circuit, the eye-opening monitoring of each reception circuit is implemented by a simple circuit configuration. Circuits to be added are only the switch and the adder and the increase in the hardware cost is a level that can be ignored.

Further, it is not necessary to separately provide phase shifters for generating the data latch clock and the boundary latch clock, and therefore, there is no deterioration of the CDR characteristics due to variations in the phase shifters in the case where two phase shifters are provided.

As explained above, according to the embodiments, a communication system and a receiver capable of performing communication at substantially a high data rate while suppressing an increase in the circuit scale and having the eye-opening monitoring function, and an eye-opening measurement method in the receiver are implemented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiver having a plurality of reception circuits configured to receive data transmitted via a plurality of lanes in accordance with a transmission clock from a common transmission clock source, wherein
    each of the plurality of reception circuits comprises:
        a clock data recovery circuit configured to extract own clock information from received data;
        a clock information switch circuit configured to select either one of the own clock information of the reception circuit and another own clock information, which is the own clock information of an another one of the plurality of reception circuits;
        a phase shifter configured to generate an adjusted clock by performing phase adjustment of a reception clock from a common reception clock source in accordance with clock information selected by the clock information switch circuit; and
        an input circuit configured to take in data transmitted in accordance with the adjusted clock, and
    the clock information switch circuit selects the own clock information in a normal operation and selects the another own clock information in an eye-opening measurement operation,
    wherein:
    the phase shifter performs phase adjustment of the reception clock in accordance with information, which is a combination of the another clock information and phase offset information that changes in accordance with a position of sweep, at the time of the eye-opening measurement,
    each of the plurality of reception circuits receives the another own clock information from the reception circuit adjacent to one side and supplies the own clock information to the reception circuit adjacent to the other side as the another own clock information, and the reception circuit at one of ends of the plurality of reception circuits receives the another own clock information from the reception circuit at the other end,
    in a first mode of eye-opening measurement modes, the odd-numbered reception circuits of the plurality of reception circuits are brought into an eye-opening measurement state and the even-numbered reception circuits into a normal operation state, and the eye-opening measurements of the odd-numbered reception circuits are performed, and
    in a second mode of the eye-opening measurement modes, the even-numbered reception circuits of the plurality of reception circuits are brought into the eye-opening measurement state and the odd-numbered reception circuits into the normal operation state, and the eye-opening measurements of the even-numbered reception circuits are performed.

2. A receiver having a plurality of reception circuits configured to receive data transmitted via a plurality of lanes in accordance with a transmission clock from a common transmission clock source, wherein
    each of the plurality of reception circuits comprises:
        a clock data recovery circuit configured to extract own clock information from received data;
        a clock information switch circuit configured to select either one of the own clock information of the reception circuit and another own clock information, which is the own clock information of an another one of the plurality of reception circuits;
        a phase shifter configured to generate an adjusted clock by performing phase adjustment of a reception clock from a common reception clock source in accordance with clock information selected by the clock information switch circuit; and
        an input circuit configured to take in data transmitted in accordance with the adjusted clock, and
    the clock information switch circuit selects the own clock information in a normal operation and selects the another own clock information in an eye-opening measurement operation,
    wherein:
    the phase shifter performs phase adjustment of the reception clock in accordance with information, which is a combination of the another clock information and phase offset information that changes in accordance with a position of sweep, at the time of the eye-opening measurement,
    the plurality of reception circuits makes pairs of two adjacent reception circuits and two reception circuits of each pair supply the own clock information to each other as the another own clock information,
    in a first mode of the eye-opening measurement modes, one of two reception circuits of each pair is brought into the eye-opening measurement state and the other into the normal operation state, and the eye-opening measurement of the one of the two reception circuits is performed, and
    in a second mode of the eye-opening measurement modes, the other of the two reception circuits of each pair is brought into the eye-opening measurement state and the one of the reception circuits into the normal operation state, and the eye-opening measurement of the other reception circuit is performed.

3. A receiver having a plurality of reception circuits configured to receive data transmitted via a plurality of lanes in accordance with a transmission clock from a common transmission clock source, wherein
    each of the plurality of reception circuits comprises:
        a clock data recovery circuit configured to extract own clock information from received data;
        a clock information switch circuit configured to select either one of the own clock information of the reception circuit and another own clock information, which is the own clock information of an another one of the plurality of reception circuits;
        a phase shifter configured to generate an adjusted clock by performing phase adjustment of a reception clock from a common reception clock source in accordance with clock information selected by the clock information switch circuit; and
        an input circuit configured to take in data transmitted in accordance with the adjusted clock, and
    the clock information switch circuit selects the own clock information in a normal operation and selects the another own clock information in an eye-opening measurement operation,
    wherein:

the phase shifter performs phase adjustment of the reception clock in accordance with information, which is a combination of the another clock information and phase offset information that changes in accordance with a position of sweep, at the time of the eye-opening measurement, one base reception circuit in the plurality of reception circuits supplies the own clock information as the another clock information to the remaining reception circuits and one of the remaining reception circuits supplies the own clock information as the another own clock information to the base reception circuit, in a first mode of the eye-opening measurement modes, the remaining reception circuits are brought into the eye-opening measurement state and the base reception circuit into the normal operation state, and the eye-opening measurements of the remaining reception circuits are performed, and in a second mode of the eye-opening measurement modes, the base reception circuit is brought into the eye-opening measurement state and the one of the remaining reception circuits into the normal operation state, and the eye-opening measurement of the base reception circuit is performed.

4. The receiver according to claim 1, wherein
each of the plurality of reception circuits comprises a difference calculation circuit configured to calculate and hold a difference between the own clock information generated by the normal operation and the another own clock information, and the plurality of reception circuits enters the eye-opening measurement mode after generating the own clock information in the normal operation, and the phase shifter performs phase adjustment of the reception clock in accordance with information, which is a combination of the another own clock information, the phase offset information, and the difference between the own clock information and the another own clock information calculated by the difference calculation circuit.

5. The communication system according to claim 4, wherein
the clock data recovery circuit of each of the plurality of reception circuits:
includes a difference calculation and holding unit configured to calculate and hold difference data from which to extract the own clock information, and
when returning from the eye-opening measurement mode to the normal operation, copies the difference data held in the difference calculation and holding unit of the other reception circuit that has supplied the another own clock information at the time of the eye-opening measurement mode and resumes generation of the own clock information from the copied difference data.

6. The receiver according to claim 2, wherein
each of the plurality of reception circuits comprises a difference calculation circuit configured to calculate and hold a difference between the own clock information generated by the normal operation and the another own clock information, and the plurality of reception circuits enters the eye-opening measurement mode after generating the own clock information in the normal operation, and the phase shifter performs phase adjustment of the reception clock in accordance with information, which is a combination of the another own clock information, the phase offset information, and the difference between the own clock information and the another own clock information calculated by the difference calculation circuit.

7. The communication system according to claim 6, wherein
the clock data recovery circuit of each of the plurality of reception circuits:
includes a difference calculation and holding unit configured to calculate and hold difference data from which to extract the own clock information, and
when returning from the eye-opening measurement mode to the normal operation, copies the difference data held in the difference calculation and holding unit of the other reception circuit that has supplied the another own clock information at the time of the eye-opening measurement mode and resumes generation of the own clock information from the copied difference data.

8. The receiver according to claim 3, wherein
each of the plurality of reception circuits comprises a difference calculation circuit configured to calculate and hold a difference between the own clock information generated by the normal operation and the another own clock information, and the plurality of reception circuits enters the eye-opening measurement mode after generating the own clock information in the normal operation, and the phase shifter performs phase adjustment of the reception clock in accordance with information, which is a combination of the another own clock information, the phase offset information, and the difference between the own clock information and the another own clock information calculated by the difference calculation circuit.

9. The communication system according to claim 8, wherein
the clock data recovery circuit of each of the plurality of reception circuits:
includes a difference calculation and holding unit configured to calculate and hold difference data from which to extract the own clock information, and
when returning from the eye-opening measurement mode to the normal operation, copies the difference data held in the difference calculation and holding unit of the other reception circuit that has supplied the another own clock information at the time of the eye-opening measurement mode and resumes generation of the own clock information from the copied difference data.

* * * * *